United States Patent [19]
Fischman

[11] 3,843,932
[45] Oct. 22, 1974

[54] WIDE BAND FREQUENCY MODULATION DETECTOR

[75] Inventor: Martin Fischman, Seneca Falls, N.Y.

[73] Assignee: GTE Sylvania Incorporated, Stamford, Conn.

[22] Filed: Nov. 14, 1973

[21] Appl. No.: 415,507

[52] U.S. Cl. ................ 329/117, 329/118, 333/30 R
[51] Int. Cl. ........................................ H03d 3/16
[58] Field of Search .................................. 330/5.5; 329/117–119; 333/30, 72

[56] References Cited

UNITED STATES PATENTS

| | | | |
|---|---|---|---|
| 3,582,838 | 6/1971 | DeVries | 330/5.5 X |
| 3,582,840 | 6/1971 | Adler | 333/30 X |
| 3,626,309 | 12/1971 | Knowles | 333/30 R |
| 3,678,364 | 7/1972 | DeVries | 329/117 |
| 3,714,594 | 1/1973 | Adler et al. | 329/117 |
| 3,750,027 | 7/1973 | Hartmann | 329/118 X |

*Primary Examiner*—Alfred L. Brody
*Attorney, Agent, or Firm*—Norman J. O'Malley; Robert E. Walrath; Cyril A. Krenzer

[57] ABSTRACT

A wide band frequency modulation detector utilizing a surface wave delay device is shown. The surface wave delay device delays the received frequency modulated signal by a predetermined amount. The delayed signal and the undelayed frequency modulated signal are applied to a product detector which reproduces the modulating signal.

9 Claims, 8 Drawing Figures

WIDE BAND FREQUENCY MODULATION DETECTOR

BACKGROUND OF THE INVENTION

This invention relates to frequency modulation detectors and more particularly to a frequency modulation detector utilizing a surface wave delay device. The general technique of combining a frequency modulated wave with a delayed representation thereof and detecting the resultant signal is known in the prior art. For example, see F. E. Terman, *Radio Engineers' Handbook*, McGraw-Hill, 1943, page 588. Such techniques, however, suffer from a number of disadvantages such as relatively costly components and changes in component characteristics over the life of the device. Furthermore, conventional delay lines are subject to delay distortion, that is, the amount of delay is dependent upon frequency so that operation is restricted to a relatively narrow band of frequencies.

Frequency discriminators utilizing surface wave devices to perform a function equivalent to the transformer and tuned circuit in conventional discriminators are also known in the prior art. Such discriminators also suffer from a number of disadvantages such as limited bandwidth and distortion.

OBJECTS AND SUMMARY OF THE INVENTION

Accordingly, it is an object of this invention to provide a frequency modulation detector that obviates the above-noted and other disadvantages of the prior art.

It is a further object of this invention to provide a frequency modulation detector operable over a relatively wide band of frequencies.

It is a further object of this invention to provide an inexpensive frequency modulation detector utilizing a surface wave device that can be batch fabricated.

It is a further object of this invention to provide a frequency modulation detector that exhibits relatively stable performance over the life of the device.

These and other objects and advantages are achieved in one aspect of this invention in a frequency modulation detector that includes means for providing a frequency modulated signal, a surface wave device, and a product detector. The surface wave device has a piezoelectric substrate, an input transducer disposed on the substrate and coupled to the signal receiver, and an output transducer disposed on the substrate and spaced from the input transducer by a distance corresponding to a predetermined time delay. The product detector is connected to the output transducer for receiving a delayed signal representative of the frequency modulated signal. Means are connected to the signal receiver and the product detector for coupling a signal representative of the frequency modulated signal to the product detector.

DETAILED DESCRIPTION OF THE PREFERRED EMBODIMENTS

For a better understanding of the present invention, together with other and further objects, advantages, and capabilities thereof, reference is made to the following disclosure and appended claims in connection with the above-described drawings.

Figures 1, 4:
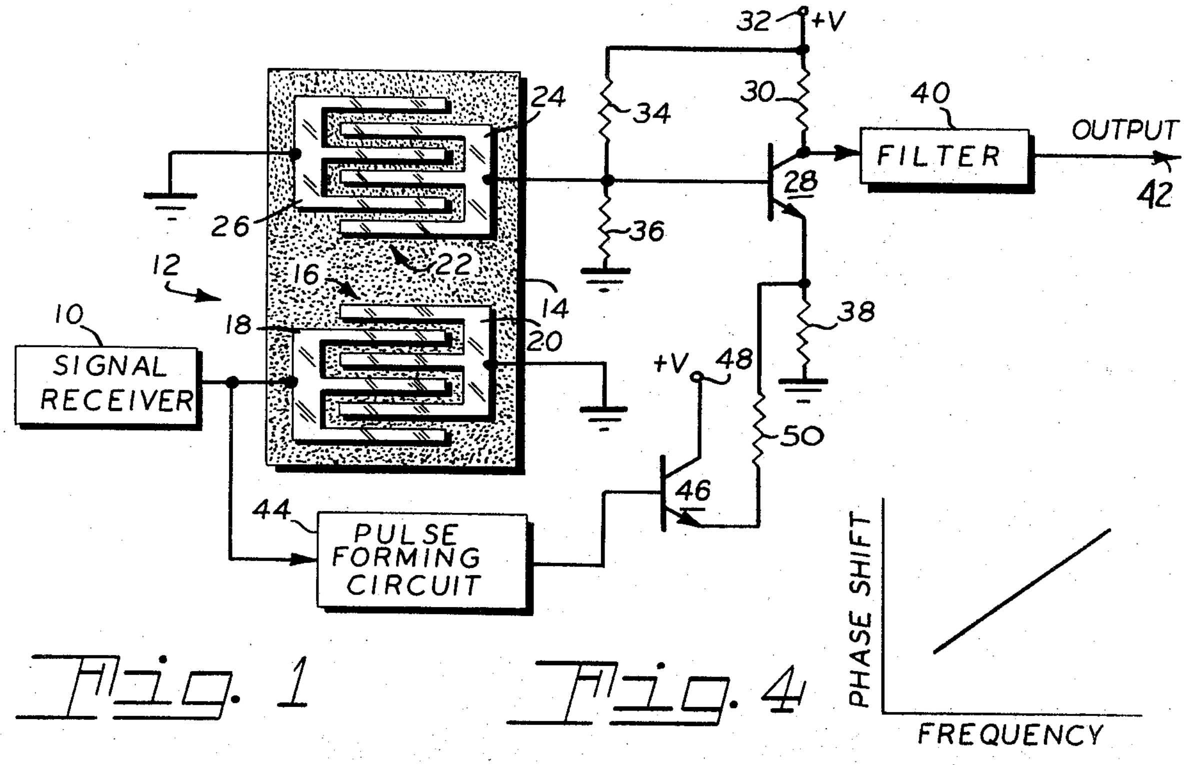
FIG. 1 is a schematic and block diagram of one embodiment of the invention.
FIG. 4 is a graph of phase shift versus frequency for a surface wave delay device.

In FIG. 1 a means for providing a frequency modulated signal illustrated as a signal receiver 10 provides a frequency modulated signal which is coupled to a surface wave device 12. Surface wave device 12 includes a piezoelectric substrate 14 constructed of a suitable piezoelectric material such as PZT, quartz, lithium niobate, lithium tantalate, ZnO, ZnS, CdS, or other suitable material for propagating acoustic surface waves in the frequency range of interest. An input transducer disposed on substrate 14 has a first comb of electrodes 18 coupled to the output of signal receiver 10 and a second comb of electrodes 20 coupled to circuit ground. Alternatively, the input signal can be differentially applied across electrodes 18 and 20. Electrodes 18 and 20 have interleaved fingers to form an interdigital transducer (IDT). An output transducer 22 is disposed on substrate 14 and spaced from input transducer 16 by a distance corresponding to a predetermined time delay. Transducer 22 has a first comb of electrodes 24 coupled to provide an output signal and a second comb of electrodes 26 coupled to circuit ground. Alternatively, a differential output signal can be taken across electrodes 24 and 26. Electrodes 24 and 26 also have interleaved fingers to form an IDT.

Electrodes 24 are coupled to an input terminal of a product detector illustrated as a base of a transistor 28 which has a collector connected by a resistor 30 to a potential source illustrated as a terminal 32. Source 32 is connected by a resistor 34 to the base of transistor 28 which is further connected by a resistor 36 to circuit ground. An emitter of transistor 28 is connected by a resistor 38 to circuit ground. The collector of transistor 28 is connected to an input of filter 40 which has an output connected to an output terminal 42.

An output of signal receiver 10 is connected to an input of a pulse forming circuit 44 which has an output connected to a second input terminal of the product detector illustrated as a base of a transistor 46. Pulse forming circuit 44 comprises a means for coupling a signal representative of the frequency modulated signal to the product detector. A collector of transistor 46 is connected to a potential source illustrated as a terminal 48 and an emitter connected by a resistor 50 to the emitter of transistor 28. Transistors 28 and 46 and their associated circuitry comprise a switching means for sampling the delayed signal from output transducer 22 during sampling pulses formed by pulse forming circuit 44.

Figure 2A:
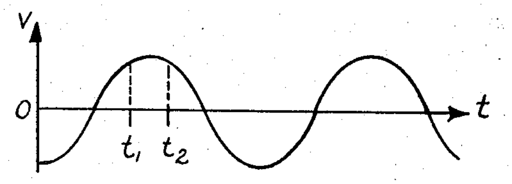
FIGS. 2A, 2B and 3A, 3B and 3C are waveform diagrams to aid in explaining the operation of the invention.
Figure 2B:
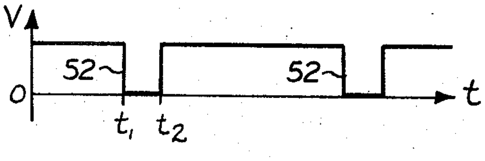

In operation, signal receiver 10 provides a frequency modulated signal which is represented by the waveform of FIG. 2A. Pulse forming circuit 44 forms pulses in response to the frequency modulated signal. In the preferred embodiment pulse forming circuit 44 is a simple limiter circuit which forms a pulse when the applied signal exceeds a predetermined amplitude. In the illustrated embodiment the frequency modulated signal exceeds a predetermined amplitude between times $t_1$ and $t_2$. Accordingly, pulse forming circuit 44 provides output pulses illustrated as negative going pulses 52 between $t_1$ and $t_2$ each cycle of the frequency modulated signal. Pulses 52 are coupled to the base of transistor 46 to turn transistor 46 off and to turn transistor 28 on. Between pulses 52 the positive voltage from pulse forming circuit 44 holds transistor 46 on such that a positive voltage of sufficient amplitude is coupled to the emitter of transistor 28 to hold transistor 28 off.

The frequency modulated signal from signal receiver 10 is also coupled to electrodes 18 of input transducer 16. Transducer 16 launches a surface wave on the surface of substrate 14 which is intercepted by output transducer 22 to provide a delayed signal representative of the frequency modulated signal. The amount of the time delay is determined by the distance between input transducer 16 and output transducer 22. The delayed signal is coupled from electrodes 24 of output transducer 22 to the base of transistor 28. Representative waveforms of the signal applied to the base of transistor 28 are illustrated in FIGS. 3A, 3B, and 3C.

Figure 3A:
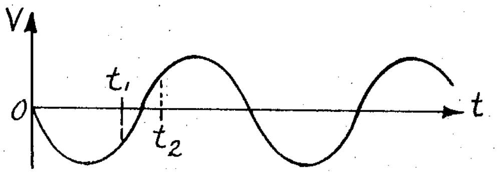

Assume that the waveform of FIG. 3A represents an unmodulated delayed signal. When each of pulses 52 gate or switch transistor 46 off and transistor 28 on, the portion of the signal represented by the waveform of FIG. 3A between $t_1$ and $t_2$ will be coupled from the base of transistor 28 to its collector and hence to filter 40. It is seen from FIG. 3A that the signal applied to filter 40 will have equal and opposite negative and positive portions with respect to a reference level, and therefore, the output signal from filter 40 will be zero. In other words, pulses 52 occurs symmetrically about the zero crossing of the signal applied to the base of transistor 28.

Figure 3B:
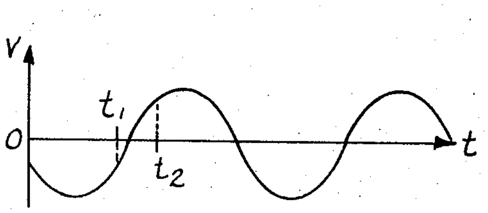
Figure 3C:
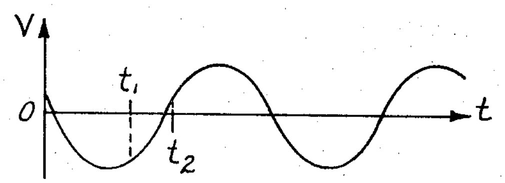

Next assume that the delayed signal is modulated such that its phase is advanced with respect to the undelayed modulated signal as is represented by the waveform of FIG. 3B. During the sampling interval $t_1$–$t_2$ one of pulses 52 gates transistor 28 on so that unequal negative and positive portions of the signal are coupled to filter 40 thereby producing an output signal at output terminal 42 of a first polarity. Similarly, when the phase of the signal applied to the base of transistor 28 is delayed with respect to the undelayed signal as is illustrated by the waveform of FIG. 3C, an output signal of a second polarity is provided.

While a particular pulse type sampling or reference signal is illustrated as the preferred embodiment, it will be evident to those skilled in the art that other suitable signals such as a square wave with equal or unequal pulse durations can be used as well. Also, other nonpulse type signals can be advantageously used in the practice of the invention.

Surface wave delay device 12 produces a constant delay at all frequencies of interest. The constant delay provides a linear phase shift versus frequency as is illustrated in FIG. 4. Thus, the instantaneous phase difference between the delayed and undelayed modulated signal is proportional to the frequency. The frequency modulations effectively cause a phase difference proportional to the modulation. In general, since the product detector provides an output signal proportional to the phase difference, the output signal is also proportional to the frequency modulation.

In the illustrated preferred embodiment surface wave delay device 12 delays the modulated signal by a number of wavelengths such that the delayed signal is in quadrature phase with respect to the signal provided by signal receiver 10 at zero frequency deviation as represented by the waveforms of FIGS. 2A and 3A. Accordingly, surface wave device 12 delays the signal by a whole number of wavelengths plus or minus one-fourth wavelength. It should be noted, however, that a quadrature phase relationship is not essential because the same effect can be obtained by altering the position of sampling pulses 52 with respect to the reference or undelayed signal represented by the waveform of FIG. 2A. For example, a sampling interval can be constructed by taking an interval about the zero crossing of the waveform of FIG. 2A which will provide the same effect as that described above although the unmodulated delayed and undelayed waves are in phase. It should also be noted that the slope of the phase shift versus frequency curve of FIG. 4, and hence, the sensitivity of the detector, is proportional to the number of whole wavelengths by which the signal is delayed in surface wave delay device 12. If the delay is greater, the slope of the curve of FIG. 4 is greater.

It is evident from the above description that a product detector, as used in this invention, operates to detect the phase of a modulated signal. The input signal is delayed by the surface wave device and applied to the product detector, while the undelayed signal is used to construct a switching or sampling signal to switch or sample the delayed signal. While a specific example of a product detector is illustrated in FIG. 1, those skilled in the art will realize that various other switching circuits can be used as well. For example, a diode bridge can be used to sample the delayed signal. Alternatively, integrated circuits which can be used as a product detector are commercially available.

Figure 5:
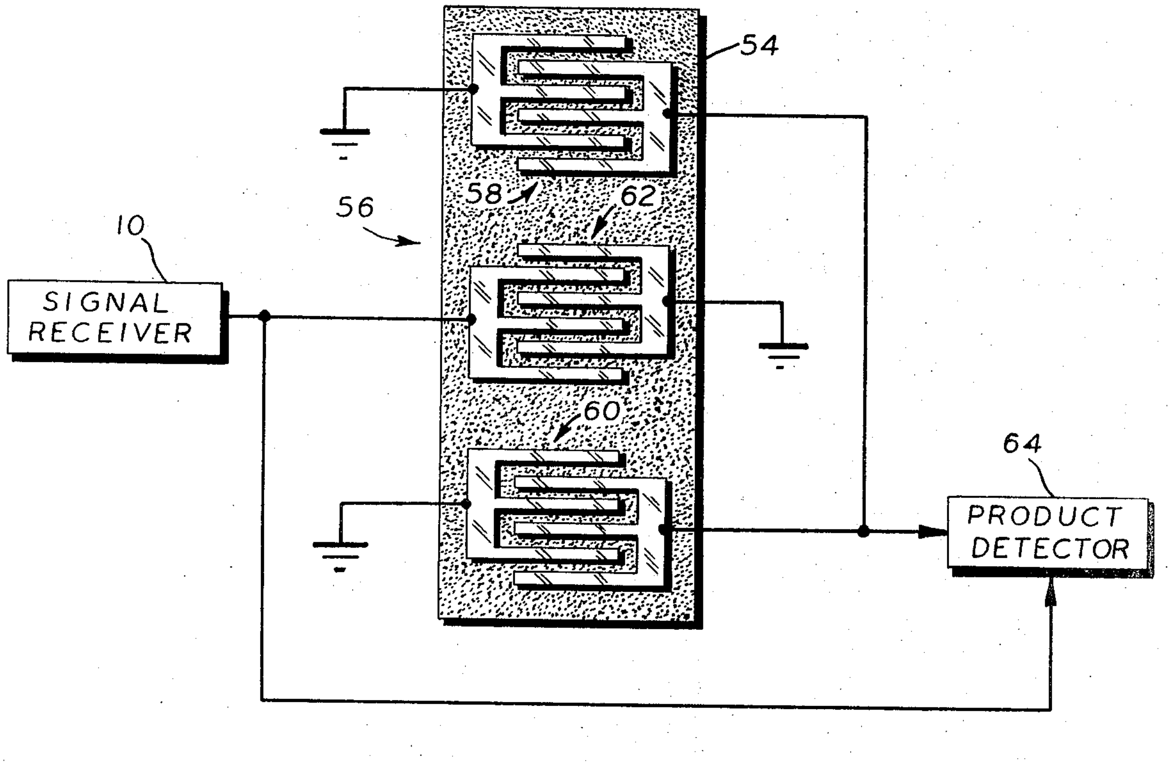
FIG. 5 is a schematic and block diagram of an alternate embodiment of the invention.

In FIG. 5 an alternate embodiment of the surface wave delay device is illustrated. Input transducer 16 of FIG. 1 launches a bidirectional surface wave on substrate 14, however, only the wave launched in the direction of output transducer 22 is utilized. In FIG. 5 piezoelectric substrate 54 of surface wave device 56 is extended and two output transducers 58 and 60 are disposed on substrate 54 on opposite sides of an input transducer 62. Input transducer 62 is similar to input transducer 16 of FIG. 1 while output transducers 58 and 60 are each similar to output transducer 22 of FIG. 1. The design constants of output transducers 58 and 60 are selected such that the output signals therefrom have the same time delay and phase relationship. Accordingly, the output signals from output transducers can be coupled in parallel to an input of a product detector 64 which can be similar to that described above. The output signal from signal receiver 10 is coupled to a second input of product detector 64. The operation of the embodiment of FIG. 5 is similar to the operation of the embodiment of FIG. 1, however, surface wave device 56 utilizes both of the bidirectional surface waves launched by input transducer 62 thereby producing a larger output signal with the same input energy.

Accordingly, there has been illustrated and described various embodiments of a frequency modulation detector which possesses numerous advantages over the prior art. A frequency modulation detector in accordance with the invention utilizes a surface wave delay device which is relatively inexpensive and stable over its life. Furthermore, a frequency modulation detector in accordance with the invention has a capability of demodulating or detecting a modulated signal with a wide band of modulating frequencies.

While there has been shown and described what is at present considered the preferred embodiments of the invention, it will be obvious to those skilled in the art that various changes and modifications may be made therein without departing from the scope of the invention as defined by the appended claims.

What is claimed is:

1. A frequency modulation detector comprising:
means for providing a frequency modulated signal;
a surface wave device having a piezoelectric substrate, an input transducer disposed on said substrate and coupled to said means for providing a frequency modulated signal, and at least one output transducer disposed on said substrate and spaced from said input transducer by a distance corresponding to a predetermined time delay;
a product detector connected to said output transducer for receiving a delayed signal representative of said frequency modulated signal; and
means connected between said means for providing a frequency modulated signal and said product detector for coupling a signal representative of said frequency modulated signal to said product detector, said product detector detecting the frequency modulations of said delayed signal.

2. A frequency modulation detector as defined in claim 1 wherein said means for coupling a signal representative of said frequency modulated signal to said product detector includes means for forming at least one sampling pulse during each cycle of said frequency modulated signal, and said product detector includes switching means for sampling said delayed signal during each of the sampling pulses.

3. A frequency modulation detector as defined in claim 1 wherein said surface wave device includes first and second output transducers disposed on said substrate on opposite sides of said input transducer and spaced from said input transducer by distances corresponding to predetermined time delay, said first and second output transducers being connected in parallel to said product detector.

4. A frequency modulation detector as defined in claim 1 wherein the magnitude of said time delay corresponds to a number of wavelengths such that said delayed signal is in quadrature phase with said frequency modulated signal.

5. A frequency modulation detector comprising:
means for providing a frequency modulated signal;
a surface wave device having a piezoelectric substrate, an input transducer disposed on said substrate and coupled to said means for providing a frequency modulated signal, and at least one output transducer disposed on said substrate and spaced from said input transducer by a distance corresponding to a predetermined time delay;
means connected to said means for providing a frequency modulated signal for forming sampling pulses representative of said frequency modulated signal; and
a product detector connected to said output transducer for receiving a delayed signal representative of said frequency modulated signal and further connected to said means for forming sampling pulses.

6. A frequency modulation detector as defined in claim 5 wherein said product detector includes switching means for sampling said delayed signal in response to said sampling pulses.

7. A frequency modulation detector as defined in claim 6 wherein said means for forming sampling pulses forms at least one sampling pulse during each cycle of said frequency modulated signal.

8. A frequency modulation detector as defined in claim 5 wherein said time delay corresponds to a number of wavelengths such that said delayed signal is in quadrature phase with said frequency modulated signal.

9. A frequency modulation detector as defined in claim 5 wherein said surface wave device includes a second output transducer disposed on said substrate on the side of said input transducer opposite said first-named output transducer and spaced from said input transducer by a distance corresponding to said predetermined time delay, said first and second output transducers being connected in parallel to said product detector.

* * * * *